(12) United States Patent
Lam et al.

(10) Patent No.: US 7,844,559 B2
(45) Date of Patent: Nov. 30, 2010

(54) METHOD AND SYSTEM FOR PREDICTING PROCESS PERFORMANCE USING MATERIAL PROCESSING TOOL AND SENSOR DATA

(75) Inventors: Hieu A. Lam, Richardson, TX (US); Hongyu Yue, Plano, TX (US); John Shriner, Allen, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/255,698

(22) Filed: Oct. 22, 2008

(65) Prior Publication Data

US 2009/0099991 A1 Apr. 16, 2009

Related U.S. Application Data

(62) Division of application No. 10/517,762, filed as application No. PCT/US03/16245 on Jun. 27, 2003, now abandoned.

(60) Provisional application No. 60/391,965, filed on Jun. 28, 2002.

(51) Int. Cl.
*G06F 17/15* (2006.01)
*G06F 17/16* (2006.01)
*H01L 21/66* (2006.01)

(52) U.S. Cl. .............................. 706/45; 706/21; 706/23; 438/17

(58) Field of Classification Search .................... 706/45
See application file for complete search history.

(56) References Cited

U.S. PATENT DOCUMENTS

| 5,642,296 | A | 6/1997 | Saxena |
| 5,888,414 | A | 3/1999 | Collins et al. |
| 5,971,591 | A | 10/1999 | Vona et al. |
| 6,183,594 | B1 | 2/2001 | Nazzal |
| 6,197,116 | B1 | 3/2001 | Kosugi |
| 6,616,759 | B2 | 9/2003 | Tanaka et al. |

FOREIGN PATENT DOCUMENTS

| JP | 4-212414 | 8/1992 |
| JP | 8-5542 | 1/1996 |
| JP | 8-246169 | 9/1996 |
| JP | 10-125660 | 5/1998 |
| WO | WO 01/18845 A1 | 3/2001 |

OTHER PUBLICATIONS

Nomikos et al., Multi-way partial least squares in monitoring batch processes, 1995.*

* cited by examiner

*Primary Examiner*—Donald Sparks
*Assistant Examiner*—Nathan H Brown, Jr.
(74) *Attorney, Agent, or Firm*—Oblon, Spivak, McClelland, Maier & Neustadt, L.L.P.

(57) ABSTRACT

A method for constructing a process performance prediction model for a material processing system, the method including the steps of: recording tool data for a plurality of observations during a process in a process tool, the tool data comprises a plurality of tool data parameters; recording process performance data for the plurality of observations during the process in the process tool, the process performance data comprises one or more process performance parameters; performing a partial least squares analysis using the tool data and the process performance data; and computing correlation data from the partial least squares analysis.

19 Claims, 17 Drawing Sheets

METHOD AND SYSTEM FOR PREDICTING PROCESS PERFORMANCE USING MATERIAL PROCESSING TOOL AND SENSOR DATA

CROSS-REFERENCE TO RELATED APPLICATIONS

The present divisional Application claims the benefit of priority under 35 U.S.C. §120 to application Ser. No. 10/517,762, filed Dec. 23, 2004, now abandoned which is the national stage of PCT/US03/16245, filed Jun. 27, 2003, which claimed priority to previously filed U.S. Application Ser. No. 60/391,965, filed on Jun. 28, 2002. This application is related to U.S. Application Ser. No. 60/391,966, filed on Jun. 28, 2002. The entire contents of these applications are incorporated herein by reference.

FIELD OF THE INVENTION

The present invention relates to material processing and more particularly to a process performance prediction system and method thereof for predicting process performance including process rate and process uniformity.

BACKGROUND OF THE INVENTION

One area of material processing in the semiconductor industry which presents formidable challenges is, for example, the manufacture of integrated circuits (ICs). Demands for increasing the speed of ICs in general, and memory devices in particular, force semiconductor manufacturers to make devices smaller and smaller on the substrate surface. Moreover, in order to reduce fabrication costs, it is necessary to reduce the number of steps (e.g., etch steps, deposition steps, etc.) required to produce an IC structure and, hence, reduce the overall complexity of the IC structure and the fabrication methods thereof. These demands are further exacerbated by both the reduction in feature size and the increase of substrate size (i.e., 200 mm to 300 mm and greater), which places greater emphasis on critical dimensions (CD), process rate and process uniformity to maximize the yield of superior devices.

For example, the precise control of trench depth is critical in the damascene structure process that is utilized for forming IC wiring levels and interconnect structures through inter-level dielectric layers. Usually, an etch stop layer is placed under a dielectric layer in order to protect the underlying layers (devices) from being damaged during over-etching. An etch stop layer generally includes a material that when exposed to the chemistry utilized for etching the dielectric layer has an etch rate less than the dielectric layer etch rate (i.e., the etch chemistry has a high etch selectivity to the dielectric layer relative to the etch stop layer). Furthermore, the etch stop layer provides a barrier for permitting an over-etch step to assure that all features on the substrate are etched to the same depth.

However, the etch stop layer complicates the process integration, increases manufacturing cost and decreases device performance. Without an etch stop layer, etch depth can vary depending on etch rate (ER) since fixed-time recipes are used. Since, for example, the etch tool is subject to equipment disturbance, the etch rate can change significantly over maintenance cycles. In order to maintain a constant etch rate, frequent tool qualification and maintenance procedures are required. Therefore, in-situ estimation of the etch rate can determine whether the process chamber is in a normal condition and can provide information to control the etch time so that the etch depth is on target.

SUMMARY OF THE INVENTION

The present invention provides for a material processing system comprising a process tool and a process performance prediction system. The process performance prediction system comprises a plurality of sensors coupled to the process tool to measure tool data and a controller coupled to the plurality of sensors in order to receive tool data. The controller is configured to predict the process performance for the process tool using the tool data.

The present invention further provides for a method of constructing a process performance prediction model for a material processing system comprising the step of recording tool data for a plurality of observations during a process in a process tool of the material processing system, where the tool data comprises a plurality of tool data parameters. The method further comprises the steps of recording process performance data for the plurality of observations during the process in the process tool of the material processing system, where the process performance data comprises one or more process performance parameters, performing a partial least squares analysis using the tool data and the process performance data, and computing correlation data from the partial least squares analysis.

The present invention further advantageously provides a method for predicting process performance of a material processing system using a process performance prediction model comprising the steps of preparing a process tool, initiating a process in the process tool, and recording tool data for at least one observation during the process in the process tool to form a tool data matrix, where the tool data comprises a plurality of tool data parameters. The method further comprises the steps of performing a matrix multiplication of the tool data matrix and a correlation matrix to form a process performance data matrix, where the correlation matrix comprises the process performance prediction model, and predicting the process performance of the material processing system from the process performance data matrix.

The present invention further advantageously provides a method for detecting a fault in a material processing system using a process performance prediction model. The method comprises the steps of preparing a process tool, initiating a process in the process tool, and recording tool data for at least one observation during the process in the process tool to form a tool data matrix, where the tool data comprises a plurality of tool data parameters. The method further comprises the steps of performing a matrix multiplication of the tool data matrix and a correlation matrix to form predicted process performance data, where the correlation matrix comprises the process performance prediction model, comparing the predicted process performance data with target process performance data, and determining a fault condition of the material processing system from the comparing step.

The present invention also advantageously provides a method for detecting a fault in a material processing system comprising the steps of recording first tool data for a plurality of observations during a first process in a process tool to form a first tool data matrix, where the first tool data comprises a plurality of tool data parameters, and recording first process performance data for the plurality of observations during the first process in the process tool to form a first process performance data matrix, where the first process performance data comprises one or more process performance parameters. The method further comprises the steps of performing a partial least squares analysis using the first tool data matrix and the first process performance data matrix, computing a correlation matrix from the partial least squares analysis, where the correlation matrix comprises a process performance prediction model, and preparing a process tool of the material processing system. The method also comprises the steps of initiating a second process in the process tool of the material processing system, recording second tool data for at least one observation during the second process in the process tool to form a second tool data matrix, where the second tool data vector comprises the plurality of tool data parameters, performing a matrix multiplication of the second tool data matrix and the correlation matrix to form predicted process performance data, comparing the predicted process performance data with target process performance data, and determining a fault condition of the material processing system from the comparing step.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF PREFERRED EMBODIMENTS

Figure 1:
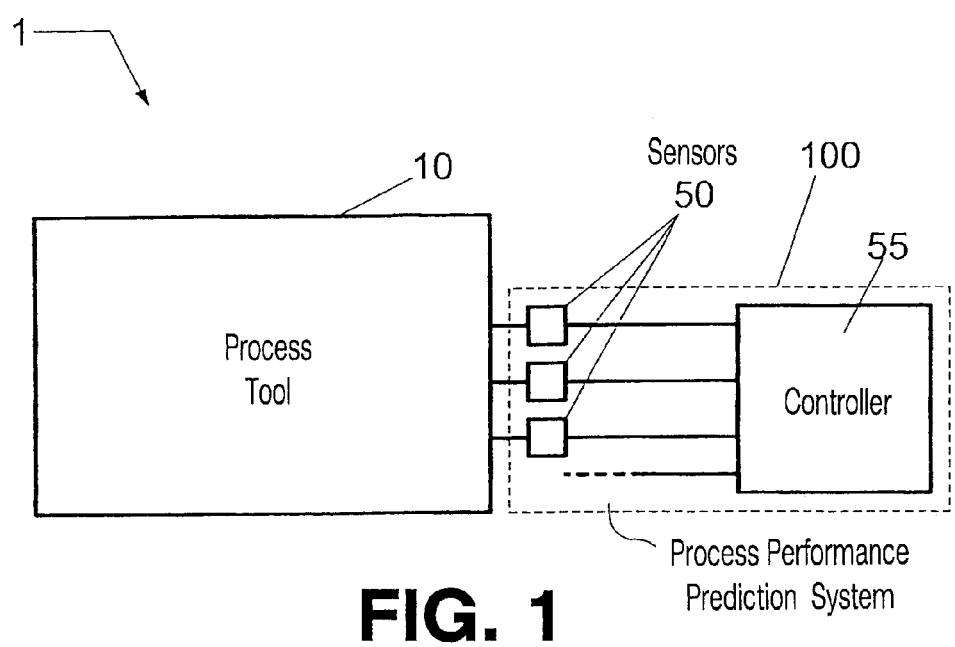
FIG. 1 shows a material processing system according to a preferred embodiment of the present invention.

According to an embodiment of the present invention, a material processing system 1 is depicted in FIG. 1 that includes a process tool 10 and a process performance prediction system 100. The process performance prediction system 100 includes a plurality of sensors 50 and a controller 55. Alternately, the material processing system 1 can include a plurality of process tools 10. The sensors 50 are coupled to the process tool 10 to measure tool data and the controller 55 is coupled to the sensors 50 in order to receive tool data. Alternately, the controller 55 is further coupled to process tool 10. Moreover, the controller 55 is configured to predict process performance data for the process tool using the tool data. The process performance data can include at least one of a process rate and a process uniformity.

In the illustrated embodiment depicted in FIG. 1, the material processing system 1 utilizes a plasma for material processing. Desirably, the material processing system 1 includes an etch chamber. Alternately, the material processing system 1 includes a photoresist coating chamber such as, for example, a photoresist spin coating system; a photoresist patterning chamber such as, for example, an ultraviolet (UV) lithography system; a dielectric coating chamber such as, for example, a spin-on-glass (SOG) or spin-on-dielectric (SOD) system; a deposition chamber such as, for example, a chemical vapor deposition (CVD) system or a physical vapor deposition (PVD) system; a rapid thermal processing (RTP) chamber such as, for example, a RTP system for thermal annealing; or a batch diffusion furnace.

Figure 2:
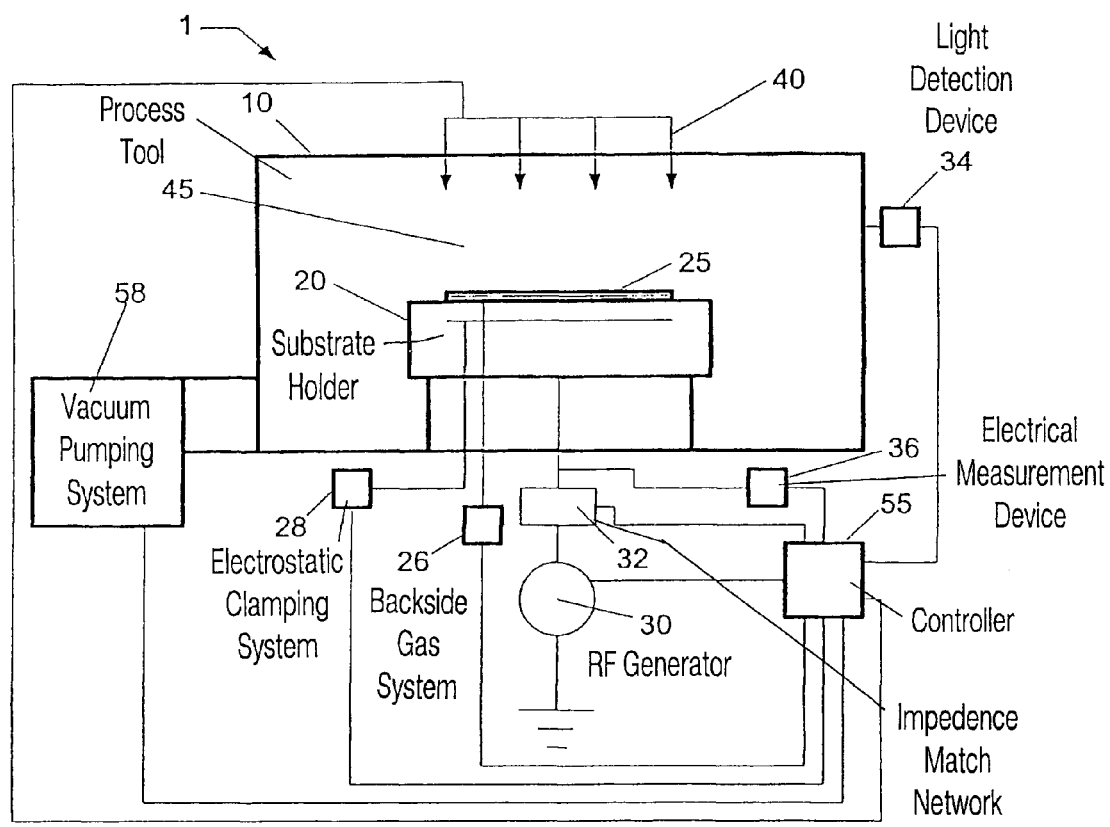
FIG. 2 shows a material processing system according to one embodiment of the present invention.

According to the illustrated embodiment of the present invention depicted in FIG. 2, the material processing system 1 includes process tool 10, substrate holder 20, upon which a substrate 25 to be processed is affixed, gas injection system 40, and vacuum pumping system 58. Substrate 25 can be, for example, a semiconductor substrate, a wafer, or a liquid crystal display (LCD). Process tool 10 can be, for example, configured to facilitate the generation of plasma in processing region 45 adjacent a surface of substrate 25, where plasma is formed via collisions between heated electrons and an ionizable gas. An ionizable gas or mixture of gases is introduced via gas injection system 40, and the process pressure is adjusted. Desirably, plasma is utilized to create materials specific to a predetermined materials process, and to aid either the deposition of material to substrate 25 or the removal of material from the exposed surfaces of substrate 25. For example, controller 55 can be used to control vacuum pumping system 58 and gas injection system 40.

Substrate 25 can be, for example, transferred into and out of process tool 10 through a slot valve (not shown) and chamber feed-through (not shown) via robotic substrate transfer system where it is received by substrate lift pins (not shown) housed within substrate holder 20 and mechanically translated by devices housed therein. Once substrate 25 is received from substrate transfer system, it is lowered to an upper surface of substrate holder 20.

For example, substrate 25 can be affixed to the substrate holder 20 via an electrostatic clamping system 28. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of the substrate via a backside gas system 26 to improve the gas-gap thermal conductance between substrate 25 and substrate holder 20. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers can be included.

As shown in FIG. 2, substrate holder 20 includes an electrode through which RF power is coupled to plasma in processing region 45. For example, substrate holder 20 can be electrically biased at an RF voltage via the transmission of RF power from RF generator 30 through impedance match network 32 to substrate holder 20. The RF bias can serve to heat electrons to form and maintain plasma. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, impedance match network 32 serves to maximize the transfer of RF power to plasma in processing chamber 10 by minimizing the reflected power. Various match network topologies (e.g., L-type, π-type, T-type, etc.) and automatic control methods can be utilized.

With continuing reference to FIG. 2, process gas can be, for example, introduced to processing region 45 through gas injection system 40. Process gas can, for example, include a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/CO/AR/C_5F_8$, $O_2/CO/Ar/C_4F_6$, $O_2/Ar/C_4F_6$, $N_2/H_2$. Gas injection system 40 includes a showerhead, where process gas is supplied from a gas delivery system (not shown) to the processing region 45 through a gas injection plenum (not shown), a series of baffle plates (not shown) and a multi-orifice showerhead gas injection plate (not shown).

Vacuum pump system 58 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) is coupled to the process chamber 16. The pressure measuring device can be, for example, a Type 628B Baratron absolute capacitance manometer commercially available from MKS Instruments, Inc. (Andover, Mass.).

As depicted in FIG. 1, process performance prediction system 100 includes a plurality of sensors 50 coupled to process tool 10 to measure tool data and a controller 55 coupled to the sensors 50 to receive tool data. The sensors 50 can include both sensors that are intrinsic to the process tool 10 and sensors extrinsic to the process tool 10. Sensors intrinsic to process tool 10 can include those sensors pertaining to the functionality of process tool 10 such as the measurement of the Helium backside gas pressure, Helium backside flow, electrostatic clamping (ESC) voltage, ESC current, substrate holder 20 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., $C_1$ and $C_2$ positions), a focus ring thickness, RF hours, focus ring RF hours, and any statistic thereof. Alternatively, sensors extrinsic to process tool 10 can include those not directly related to the functionality of process tool 10 such as a light detection device 34 for monitoring the light emitted from the plasma in processing region 45 as shown in FIG. 2, or an electrical measurement device 36 for monitoring the electrical system of process tool 10 as shown in FIG. 2.

The light detection device 34 can include a detector such as a (silicon) photodiode or a photomultiplier tube (PMT) for measuring the total light intensity emitted from the plasma. The light detection device 34 can further include an optical filter such as a narrow-band interference filter. In an alternate embodiment, the light detection device 34 includes a line CCD (charge coupled device) or CID (charge injection device) array and a light dispersing device such as a grating or a prism. Additionally, light detection device 34 can include a monochromator (e.g., grating/detector system) for measuring light at a given wavelength, or a spectrometer (e.g., with a rotating grating) for measuring the light spectrum such as, for example, the device described in U.S. Pat. No. 5,888,337.

The light detection device 34 can include a high resolution OES sensor from Peak Sensor Systems. Such an OES sensor has a broad spectrum that spans the ultraviolet (UV), visible (VIS) and near infrared (NIR) light spectrums. The resolution is approximately 1.4 Angstroms, that is, the sensor is capable of collecting 5550 wavelengths from 240 to 1000 nm. The sensor is equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

The electrical measurement device 36 can include, for example, a current and/or voltage probe, a power meter, or spectrum analyzer. For example, plasma processing systems often employ RF power to form plasma, in which case, an RF transmission line, such as a coaxial cable or structure, is employed to couple RF energy to the plasma through an electrical coupling element (i.e., inductive coil, electrode, etc.). Electrical measurements using, for example, a current-voltage probe, can be exercised anywhere within the electrical (RF) circuit, such as within an RF transmission line. Furthermore, the measurement of an electrical signal, such as a time trace of voltage or current, permits the transformation of the signal into frequency space using discrete Fourier series representation (assuming a periodic signal). Thereafter, the Fourier spectrum (or for a time varying signal, the frequency spectrum) can be monitored and analyzed to characterize the state of material processing system 1. A voltage-current probe can be, for example, a device as described in detail in pending U.S. Application Ser. No. 60/259,862 filed on Jan. 8, 2001, and U.S. Pat. No. 5,467,013, each of which is incorporated herein by reference in its entirety.

In alternate embodiments, electrical measurement device 36 can include a broadband RF antenna useful for measuring a radiated RF field external to material processing system 1. A commercially available broadband RF antenna is a broadband antenna such as Antenna Research Model RAM-220 (0.1 MHz to 300 MHz).

In general, the plurality of sensors 50 can include any number of sensors, intrinsic and extrinsic, which can be coupled to process tool 10 to provide tool data to the controller 55.

Controller 55 includes a microprocessor, memory, and a digital I/O port (potentially including D/A and/or A/D converters) capable of generating control voltages sufficient to communicate and activate inputs to material processing system 1 as well as monitor outputs from material processing system 1. As shown in FIG. 2, controller 55 can be coupled to and exchange information with RF generator 30, impedance match network 32, gas injection system 40, vacuum pump system 58, backside gas delivery system 26, electrostatic clamping system 28, light detection device 34, and electrical measurement device 36. A program stored in the memory is utilized to interact with the aforementioned components of a material processing system 1 according to a stored process recipe. One example of controller 55 is a DELL PRECISION WORKSTATION 530™, available from Dell Corporation, Austin, Tex.

Figure 3:
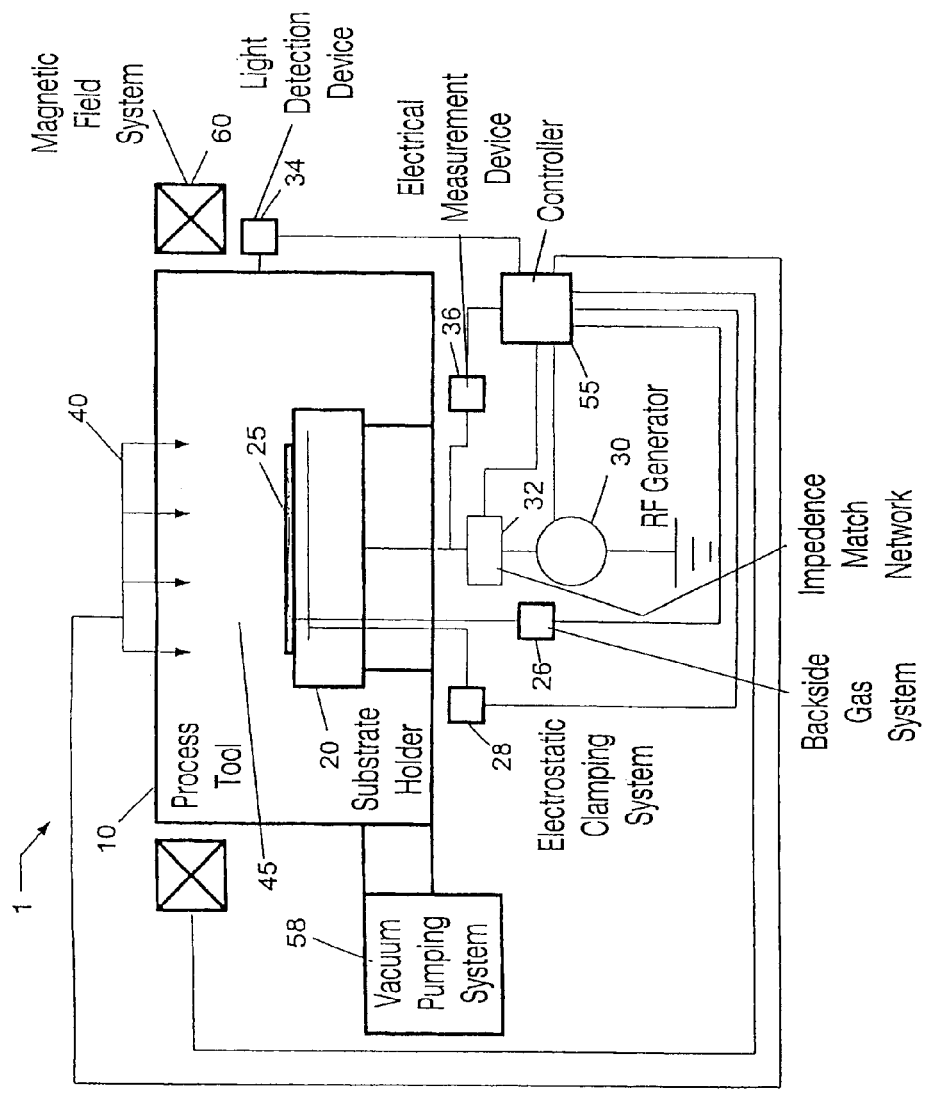
FIG. 3 shows a material processing system according to another embodiment of the present invention.

As shown in FIG. 3, material processing system 1 can include a magnetic field system 60. For example, the magnetic field system 60 can include a stationary, or either a mechanically or electrically rotating DC magnetic field in order to potentially increase plasma density and/or improve material processing uniformity. Moreover, controller 55 can be coupled to magnetic field system 60 in order to regulate the field strength or speed of rotation.

Figure 4:
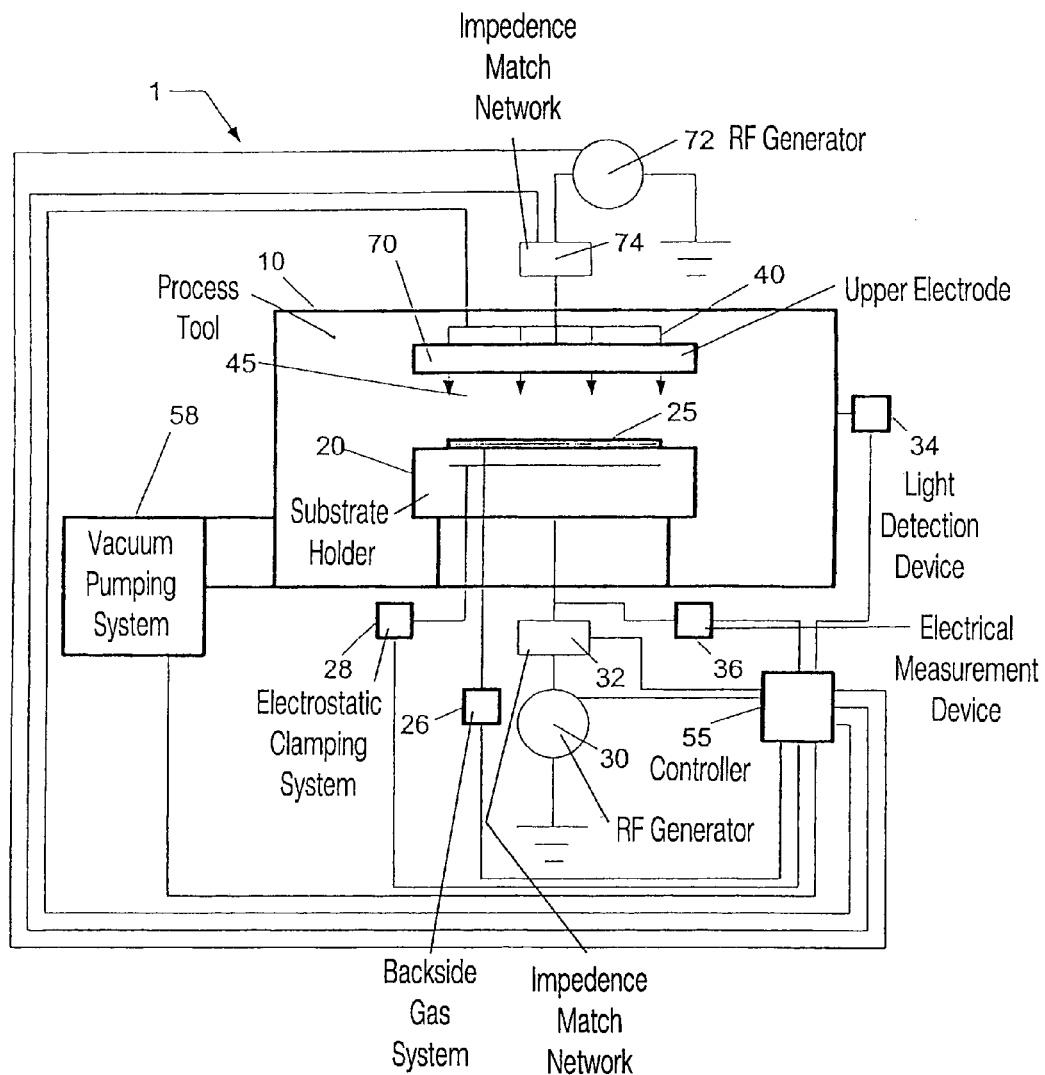
FIG. 4 shows a material processing system according to a further embodiment of the present invention.

As shown in FIG. 4, the material processing system can include an upper electrode 70. For example, RF power can be coupled from RF generator 72 through impedance match network 74 to upper electrode 70. A frequency for the application of RF power to the upper electrode preferably ranges from 10 MHz to 200 MHz and is preferably 60 MHz. Additionally, a frequency for the application of power to the lower electrode can range from 0.1 MHz to 30 MHz and is preferably 2 MHz. Moreover, controller 55 can be coupled to RF generator 72 and impedance match network 74 in order to control the application of RF power to upper electrode 70.

Figure 5:
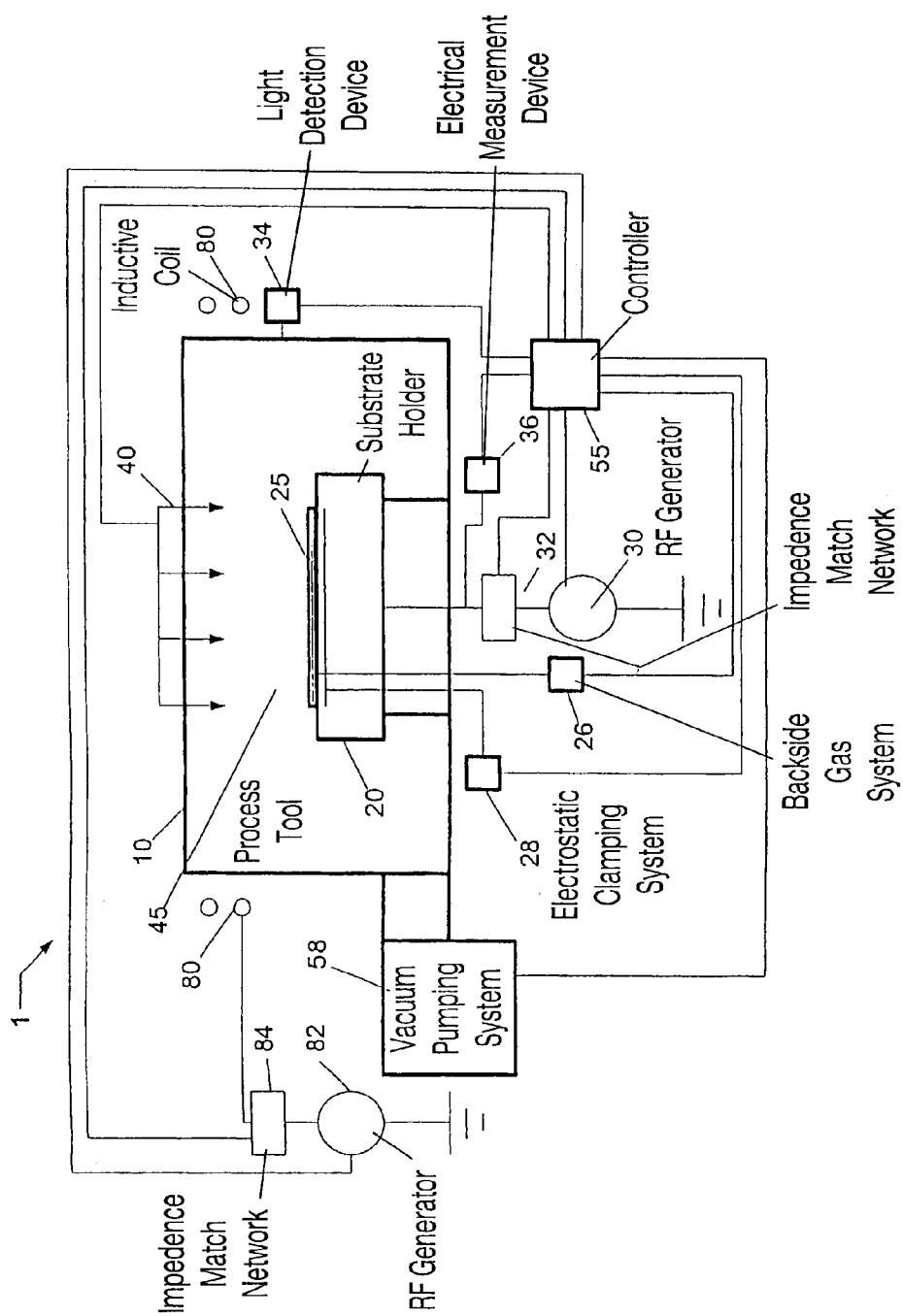
FIG. 5 shows a material processing system according to an additional embodiment of the present invention.

As shown in FIG. 5, the material processing system of FIG. 1 can include an inductive coil 80. For example, RF power can be coupled from RF generator 82 through impedance match network 84 to inductive coil 80, and RF power can be inductively coupled from inductive coil 80 through dielectric window (not shown) to plasma processing region 45. A frequency for the application of RF power to the inductive coil 80 preferably ranges from 10 MHz to 100 MHz and is preferably 13.56 MHz. Similarly, a frequency for the application of power to the chuck electrode preferably ranges from 0.1 MHz to 30 MHz and is preferably 13.56 MHz. In addition, a slotted Faraday shield (not shown) can be employed to reduce capacitive coupling between the inductive coil 80 and plasma. Moreover, controller 55 can be coupled to RF generator 82 and impedance match network 84 in order to control the application of power to inductive coil 80. In an alternate embodiment, inductive coil 80 can be a "spiral" coil or "pancake" coil in communication with the plasma processing region 45 from above as in a transformer coupled plasma (TCP) reactor.

Alternately, the plasma can be formed using electron cyclotron resonance (ECR). In yet another embodiment, the plasma is formed from the launching of a Helicon wave. In yet another embodiment, the plasma is formed from a propagating surface wave.

As discussed above, the process performance prediction system 100 includes plurality of sensors 50 and a controller 55, where the sensors 50 are coupled to process tool 10 and the controller 55 is coupled to the sensors 50 to receive tool data. The controller 55 is further capable of executing at least one algorithm to optimize the tool data received from the sensors 50, determine a relationship (model) between the tool data and process performance data, and use the relationship (model) for fault detection and/or prediction.

Table 1 presents an exemplary set of tool data, to be correlated with process performance data, including sixty-one tool data parameters.

TABLE 1

Exemplary tool data.

| PARAMETER | DESCRIPTION |
| --- | --- |
| APC | Adaptive pressure control valve setting |
| HE_C_PRESS | Helium backside pressure (center), Average |
| AR_FLOW | Argon gas flow rate, Average |
| PRESSURE | Chamber pressure, Average |
| UPPER_TEMP | UEL temperature, Average |
| VIP_Z | Current-voltage probe impedance, Average |
| HE_C_FLOW-S | Helium backside flow (center), Standard deviation |
| ESC_VOLTAGE-S | Electrostatic clamp voltage, Standard deviation |
| MAGNITUDE-S | Match network control signal, magnitude, Standard deviation |
| RF_VDC-S | DC voltage, RF system, Standard deviation |
| VIP_RF_ON-S | Current voltage probe on/off status, Standard deviation |
| C1_POSITION | Capacitor no. 1 position, Average |
| HE_E_PRES | Helium backside pressure (edge), Average |
| C5F8_FLOW | C5F8 gas flow rate, Average |
| RF_FORWARD | Forward RF power, Average |
| VIP_I | Current-voltage probe current, Average |
| WALL_TEMP | Chamber wall temperature, Average |
| HE_E_FLOW-S | Helium backside flow (edge), Standard deviation |
| O2_FLOW-S | Oxygen gas flow rate, Standard deviation |
| PHASE-S | Match network control signal, phase, Standard deviation |

TABLE 1-continued

Exemplary tool data.

| PARAMETER | DESCRIPTION |
| --- | --- |
| RF VPP-S | RF voltage peak-to-peak, Standard deviation |
| VIP__V-S | Current-voltage probe voltage, Standard deviation |
| HE__E__FLOW | Helium backside flow (edge), Average |
| O2__FLOW | Oxygen gas flow rate, Average |
| PHASE | Match network control signal, phase, Average |
| RF__VPP | RF voltage peak-to-peak, Average |
| VIP__V | Current-voltage probe voltage, Average |
| C2__POSITION-S | Capacitor no. 2 position, Standard deviation |
| ESC__CURRENT-S | Electrostatic clamp current, Standard deviation |
| LOWER__TEMP-S | LEL temperature, Standard deviation |
| RF__REFLECT-S | Reflected RF power, Standard deviation |
| RF__FORWARD-S | Forward RF power, Standard deviation |
| C2__POSITION | Capacitor no. 2 position, Average |
| ESC__CURRENT | Electrostatic clamp current, Average |
| LOWER__TEMP | LEL temperature, Average |
| RF__REFLECT | Reflected RF power, Average |
| VIP__PHASE | Current-voltage probe phase, Average |
| APC-S | Adaptive pressure control valve setting, Standard deviation |
| HE__C__PRES-S | Helium backside pressure (center), Standard deviation |
| AR__FLOW-S | Argon gas flow rate, Standard deviation |
| PRESSURE-S | Chamber pressure, Standard deviation |
| UPPER__TEMP-S | UEL temperature, Standard deviation |
| VIP__Z-S | Current-voltage probe impedance, Standard deviation |
| HE__C__FLOW | Helium backside flow (center), Average |
| ESC__VOLTAGE | Electrostatic clamp voltage, Average |
| MAGNITUDE | Match network control signal, magnitude, Average |
| RF__VDC | DC voltage, RF system, Average |
| VIP__RF__ON | Current voltage probe on/off status, Average |
| C1__POSITION-S | Capacitor no. 1 position, Standard deviation |
| HE__E__PRES-S | Helium backside pressure (edge), Standard deviation |
| C5F8__FLOW-S | C5F8 gas flow rate, Standard deviation |
| VIP__I-S | Current-voltage probe current, Standard deviation |
| WALL__TEMP-S | Chamber wall temperature, Standard deviation |
| VIP__PHASE-S | Current-voltage probe phase, Standard deviation |
| RF__HR | RF hours |
| SLOT__ID | Wafer slot index |
| RF__HRxFR__THK | RF hours (X) Focus ring thickness |
| RF__HRxFR__RFHR | RF hours (X) Focus ring RF hours |
| FR__THK | Focus ring thickness |
| FR__RFHR | Focus ring RF hours |
| FR__THKxFR__RFHR | Focus ring thickness (X) Focus ring RF hours |

Moreover, an exemplary set of process performance data pertaining to trench etching as part of a damascene process can include a trench mean etch depth and a trench etch depth range. The mean etch depth can, for example, include a spatial average of the trench etch depth at a plurality of locations on a substrate. The trench etch depth range can, for example, include a minimum-maximum range, a variance, a standard deviation, or a root mean square (rms) of the data scatter about the mean value for the etch depth.

The measurement of the trench etch depth and trench etch depth range can be performed directly using a scanning electron microscope (SEM) to view SEM micrographs from cleaved substrates, or indirectly using advanced, in-situ technology such as, for example, DUV spectroscopic ellipsometry (e.g., see "Specular spectroscopic scatterometry", *IEEE Transactions on Semiconductor Manufacturing*, Vol. 14, No. 2, May 2001) which is incorporated herein by reference in its entirety. A commercially available product featuring optical digital profilometry (ODP) is sold and distributed by Timbre Technologies, Inc., A TEL Company (5341 Randall Place, Fremont, Calif. 94538) coupled with the hardware from Therma-Wave, Inc. (1250 Reliance Way, Fremont, Calif. 94539).

Each set of data, including both tool data and corresponding process performance data, includes an observation set, where either a single observation can be made per substrate or a plurality of observations can be performed per substrate. Each observation in an observation set, including both tool data and process performance data, can include an $n^{th}$ order statistic (i.e., time average, rms of time trace, skewness of time trace, etc.). For example, each observation set can correspond to a substrate processed, where each tool data parameter is sampled during the length of the process, trimmed (i.e., data at the start and end of the sampled data is trimmed to remove start/end transients), and averaged.

Given a plurality of observations sets, a relationship can be determined between the tool data in the plurality of observation sets and the process performance data in the plurality of observation sets using multivariate analysis (MVA). One exemplary MVA technique for determining such a relationship is partial least squares (PLS) modeling.

Using PLS, observation sets of tool data are received from a plurality of sensors 50 and recorded using controller 55. For each observation set, tool data can be stored as a row in a matrix $\overline{X}$ and process performance data can be stored as a row in matrix $\overline{Y}$. Hence, once the matrix $\overline{X}$ is assembled, each row represents a different observation and each column represents a different tool data parameter (from Table 1), and, once the matrix $\overline{Y}$ is assembled, each row represents a different observation and each column represents a different process performance parameter. Hence, using the set of parameters in Table 1, matrix $\overline{X}$ is a rectangular matrix of dimensions M by sixty-one, where M is the number of observation sets. Similarly, matrix $\overline{Y}$ is a rectangular matrix of dimensions M by two. More generally, matrix $\overline{X}$ can be an m by n matrix, and matrix $\overline{Y}$ can be an m by p matrix. Once all of the data is stored in the matrices, the data can be mean-centered and/or normalized, if desired. The process of mean-centering the data stored in a matrix column involves computing a mean value of the column elements and subtracting the mean value from each element. Moreover, the data residing in a column of the matrix can be normalized by the standard deviation of the data in the column.

In the following discussion, a set of tool data and process performance data is utilized from forty-five substrates in order to present the method by which tool data are optimized and a model is established for relating the tool data and the process performance data (i.e., M equals forty-five in the above discussion). The forty-five process runs (substrates) includes three sets of substrates processed in an etch chamber, where each set of substrates is preceded by a chamber wet clean. The tool data included in the PLS analysis model is listed in Table 1, and the process performance data includes the mean trench etch depth and the trench etch depth range.

In the PLS analysis, a set of loading (or correlation) coefficients can be defined which relate the tool data ($\overline{X}$) to the process performance data ($\overline{Y}$). In general, for multivariate analysis, the relationship between the tool data and the process performance data can be expressed as follows:

$$\overline{X}\overline{B}=\overline{Y};  \quad (1)$$

where $\overline{X}$ represents the m by n matrix described above, $\overline{B}$ represents an n by p (p<n) loading (or correlation) matrix and $\overline{Y}$ represents the m by p matrix described above.

Once the data matrices $\overline{X}$ and $\overline{Y}$ are assembled, a relationship designed to best approximate the $\overline{X}$ and $\overline{Y}$ spaces and to maximize the correlation between $\overline{X}$ and $\overline{Y}$ is established using PLS analysis.

In the PLS analysis model, the matrices $\overline{X}$ and $\overline{Y}$ are decomposed as follows:

$$\overline{X}=\overline{T}\overline{P}^T+\overline{E}; \quad (2a)$$

$$\overline{Y}=\overline{U}\overline{C}^T+\overline{F}; \quad (2b)$$

and $$\overline{U}=\overline{T}+\overline{H}; \quad (2c)$$

where $\overline{T}$ is a matrix of scores that summarizes the $\overline{X}$ variables, $\overline{P}$ is a matrix of loadings for matrix $\overline{X}$, $\overline{U}$ is a matrix of scores that summarizes the $\overline{Y}$ variables, $\overline{C}$ is a matrix of weights expressing the correlation between $\overline{Y}$ and $\overline{T}(\overline{X})$, and $\overline{E}$, $\overline{F}$ and $\overline{H}$ are matrices of residuals. Furthermore, in the PLS analysis model, there are additional loadings $\overline{W}$ called weights that correlate $\overline{U}$ and $\overline{X}$, and are used to calculate $\overline{T}$. In summary, the PLS analysis geometrically corresponds to fitting a line, plane or hyper plane to both the $\overline{X}$ and $\overline{Y}$ data represented as points in a multidimensional space, with the objective of closely approximating the original data tables $\overline{X}$ and $\overline{Y}$, and maximizing the covariance between the observation positions on the hyper planes.

Figure 6:
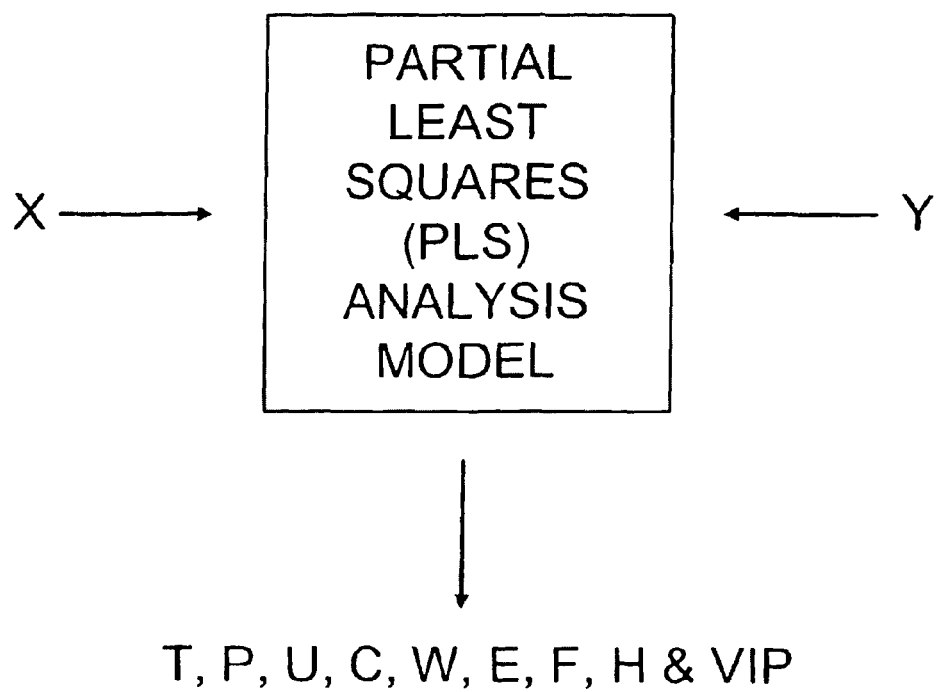
FIG. 6 presents a schematic representation of some of the inputs and outputs for a partial least squares (PLS) analysis model.

FIG. 6 provides a schematic representation of the data inputs, $\overline{X}$ and $\overline{Y}$, to the PLS analysis and the corresponding outputs $\overline{T}$, $\overline{P}$, $\overline{U}$, $\overline{C}$, $\overline{W}$, $\overline{E}$, $\overline{F}$, $\overline{H}$ and variable importance in the projection (VIP). An example of a commercially available software which supports PLS analysis modeling is SIMCA-P 8.0. For further details on this software see the User's Manual (User Guide to SIMCA-P 8.0: A new standard in multivariate data analysis, Umetrics AB, Version 8.0, September 1999).

In general, SIMCA-P outputs other important information regarding the descriptive power of the model (e.g., the quality of the correlation obtained between $\overline{X}$ and $\overline{Y}$), and the predictive power of the model. For example, SIMCA-P iteratively computes one PLS component at a time, that is one vector each of X-scores $\overline{T}$, Y-scores $\overline{U}$, weights $\overline{W}$ and $\overline{C}$, and loadings $\overline{P}$. The PLS components are calculated in descending order of importance. After each PLS component, SIMCA-P can display the following: the fraction of the sum of squares (SS) of all Y's and X's explained by the current component ($R^2X$, $R^2Y$); the fraction of variance of all the Y's and X's explained by the current component ($R^2Xadj$, $R^2Yadj$); the cumulative SS of all the Y's and X's explained by all extracted components ($R^2X(cum)$, $R^2Y(cum)$); and the cumulative variance of all the Y's and X's explained by all extracted components ($R^2Xadj(cum)$, $R^2Yadj(cum)$).

Figure 7:
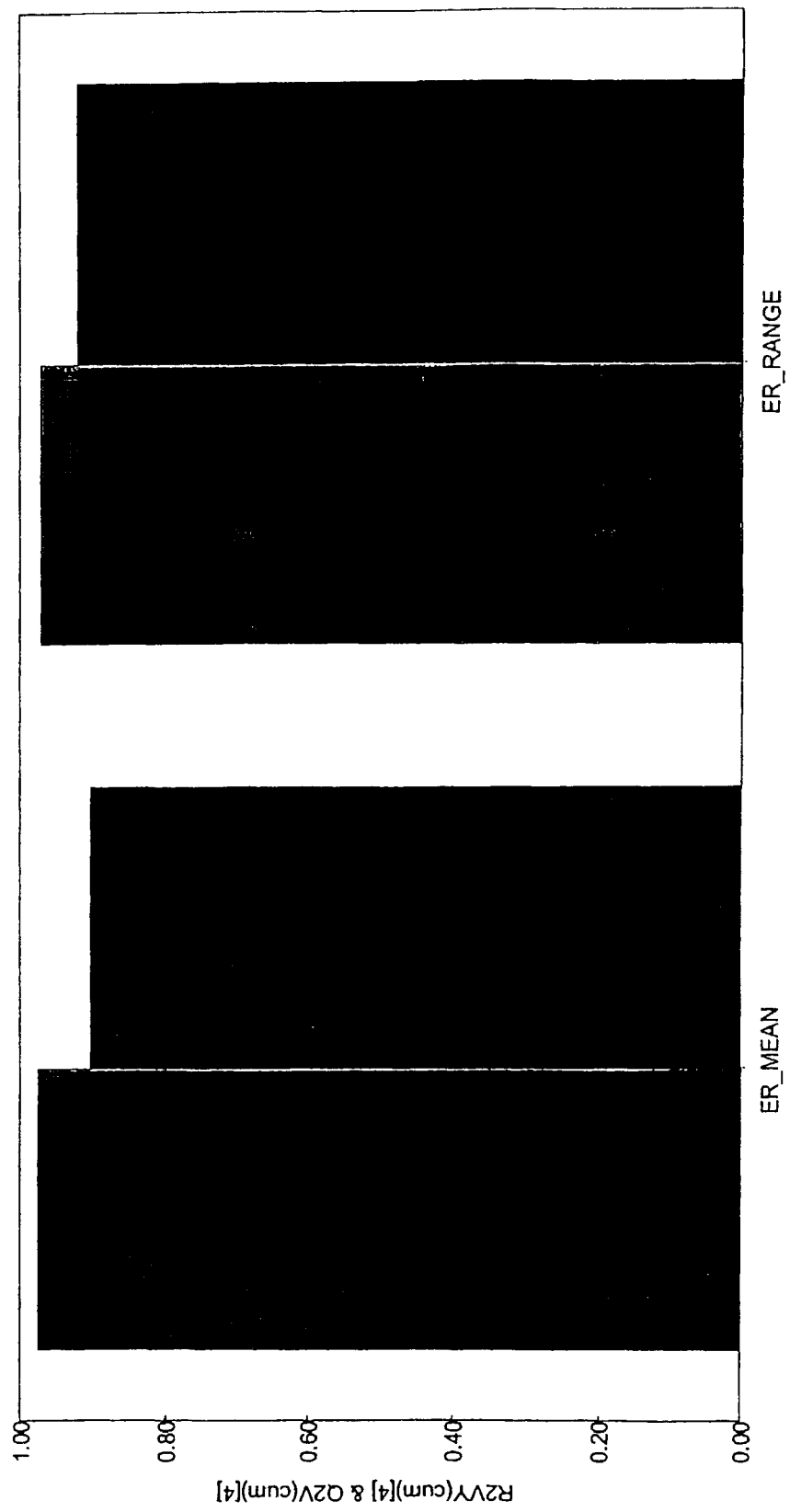
FIG. 7 presents an output of statistics from a PLS analysis model.

Furthermore, for every active variable, the fraction of SS ($R^2V$) or variance ($R^2Vadj$) explained can be displayed. This value is computed for both the current component and accumulated over all PLS components. For response variables $\overline{Y}$, this value corresponds to $R^2$ (the multiple correlation coefficient), the "goodness" of the fit. For example, utilizing the data above, FIG. 7 presents this value for $\overline{Y}$ ($R^2VY(cum)$) for each process performance parameter, namely, the mean etch depth and the etch depth range. By inspection of FIG. 7, the "goodness" of each fit exceeds ninety-seven percent when using the first four PLS components.

In general, additional criterion used to determine the model dimensionality (number of significant PLS components), is cross validation. With cross validation, observations are kept out of the model development, then the response values ($\overline{Y}$) for the kept out observations are predicted by the model, and compared with the actual values. This procedure is repeated several times until every observation has been kept out once and only once. The prediction error sum of squares (PRESS) is the squared differences between observed $\overline{Y}$ and predicted values when the observations were kept out. For every dimension, the overall PRESS/SS is computed, where SS is the residual sum of squares of the previous dimension, and also (PRESS/SS)$_m$ for each $\overline{Y}$ variable (m). These values are good measures of the predictive power of the model, which determine a minimum number of PLS components that substantially explain a correlation between the tool data and the process performance data. For example, SIMCA-P can present this information as follows: the fraction of the total variation of the Y's that can be predicted by a component ($Q^2=(1.0-PRESS/SS)$; the fraction of the variation of a variable $Y_m$ that can be predicted by a component ($Q^2V=(1.0-PRESS/SS)_m$; the cumulative $Q^2$ for the extracted components ($Q^2_{cum}=\square(1.0-PRESS/SS)_a$; and the cumulative $Q^2V$ of a variable ($Q^2V_{cum}=\square(0.1-PRESS/SS)_{ka}$). FIG. 7 further presents the predictive power ($Q^2V_{cum}$) for each process performance parameter, namely, the mean etch depth and the etch depth range. By inspection of FIG. 7, the predictive power of each fit exceeds ninety-one percent when using the first four PLS components.

Figure 8:
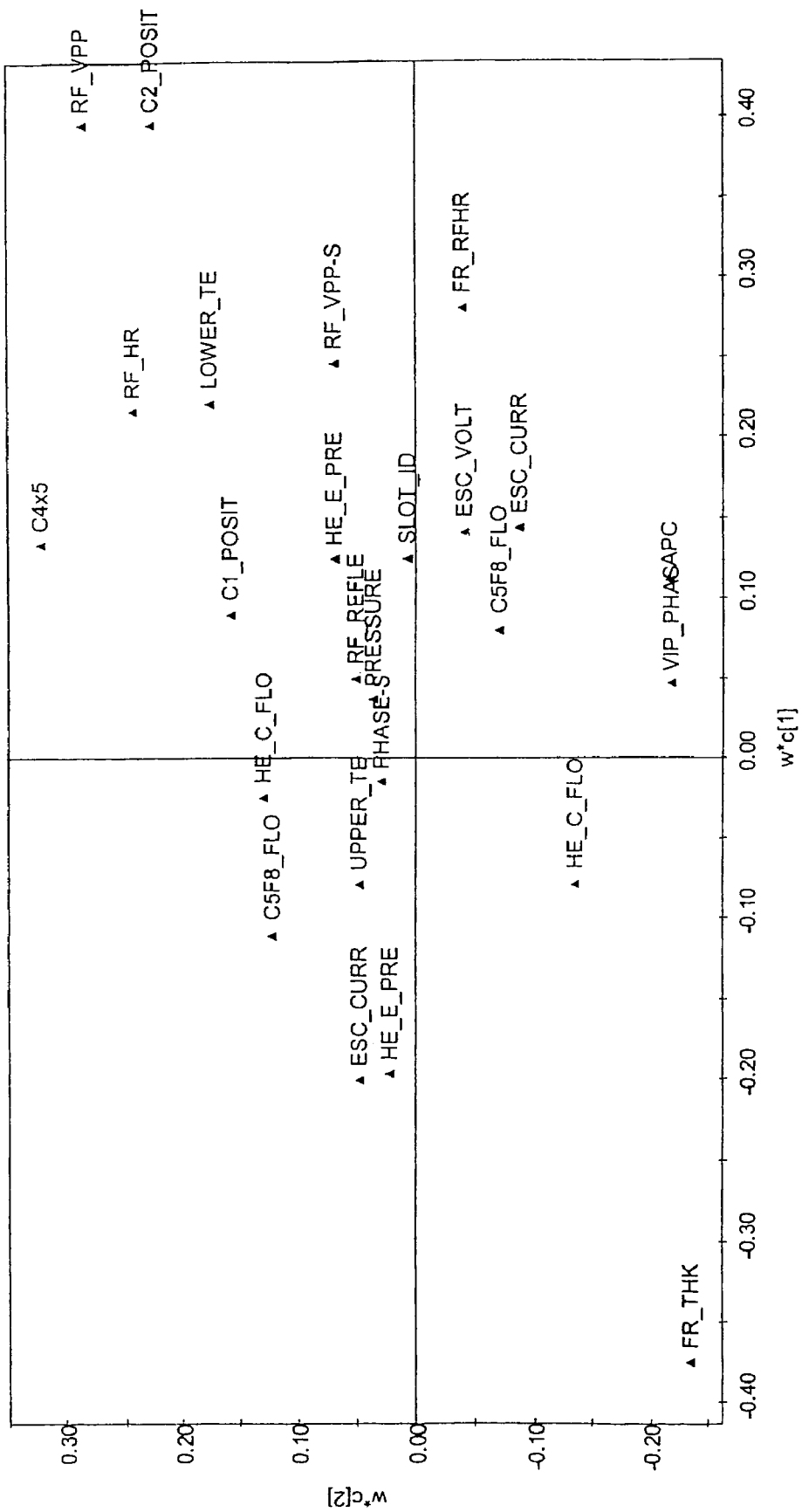
FIG. 8 presents a plot of work set loadings w*c(1) versus w*c(2)

FIG. 8 presents the work set loadings, w*c(1) versus w*c(2), for the tool data and process performance data described above. The plot shows both the X-weights (w or w*) and Y-weights (c), and thereby the correlation structure between $\overline{X}$ and $\overline{Y}$. One sees how the $\overline{X}$ and $\overline{Y}$ variables combine in the projections, and how the $\overline{X}$ variables relate to the $\overline{Y}$ variables. For instance, two regions (upper right hand corner and lower left hand corner) indicate where a "strong" correlation exists between the tool data parameters and the process performance parameters.

Figure 9:
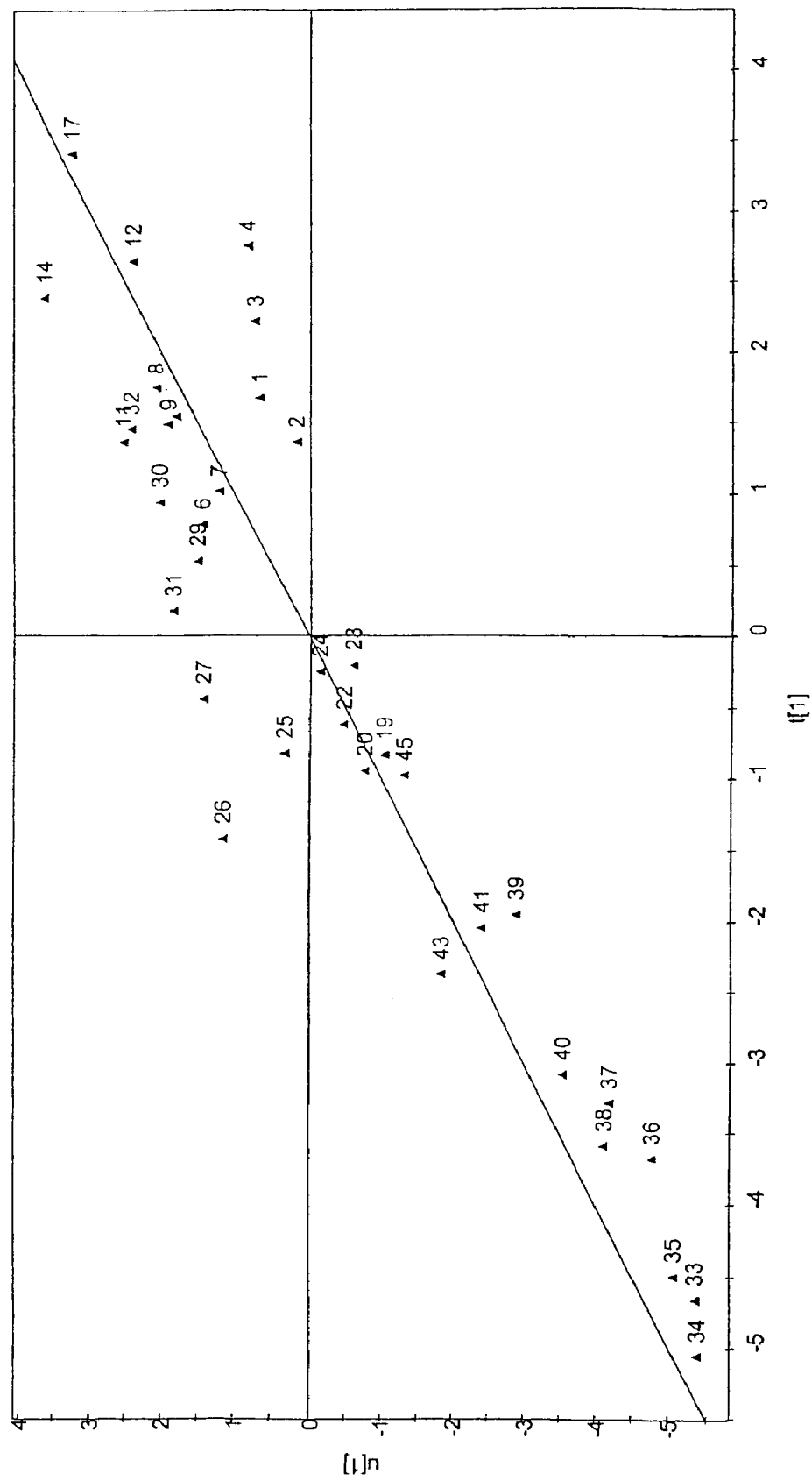
FIG. 9 presents a plot of work set scores t(1) versus u(1)

FIG. 9 presents the work set scores, t(1) versus u(1). This plot displays the objects in the projected X(T) and Y(U) space, and shows how well the Y space coordinate (u) correlates with the X space coordinate (t).

Figure 10:
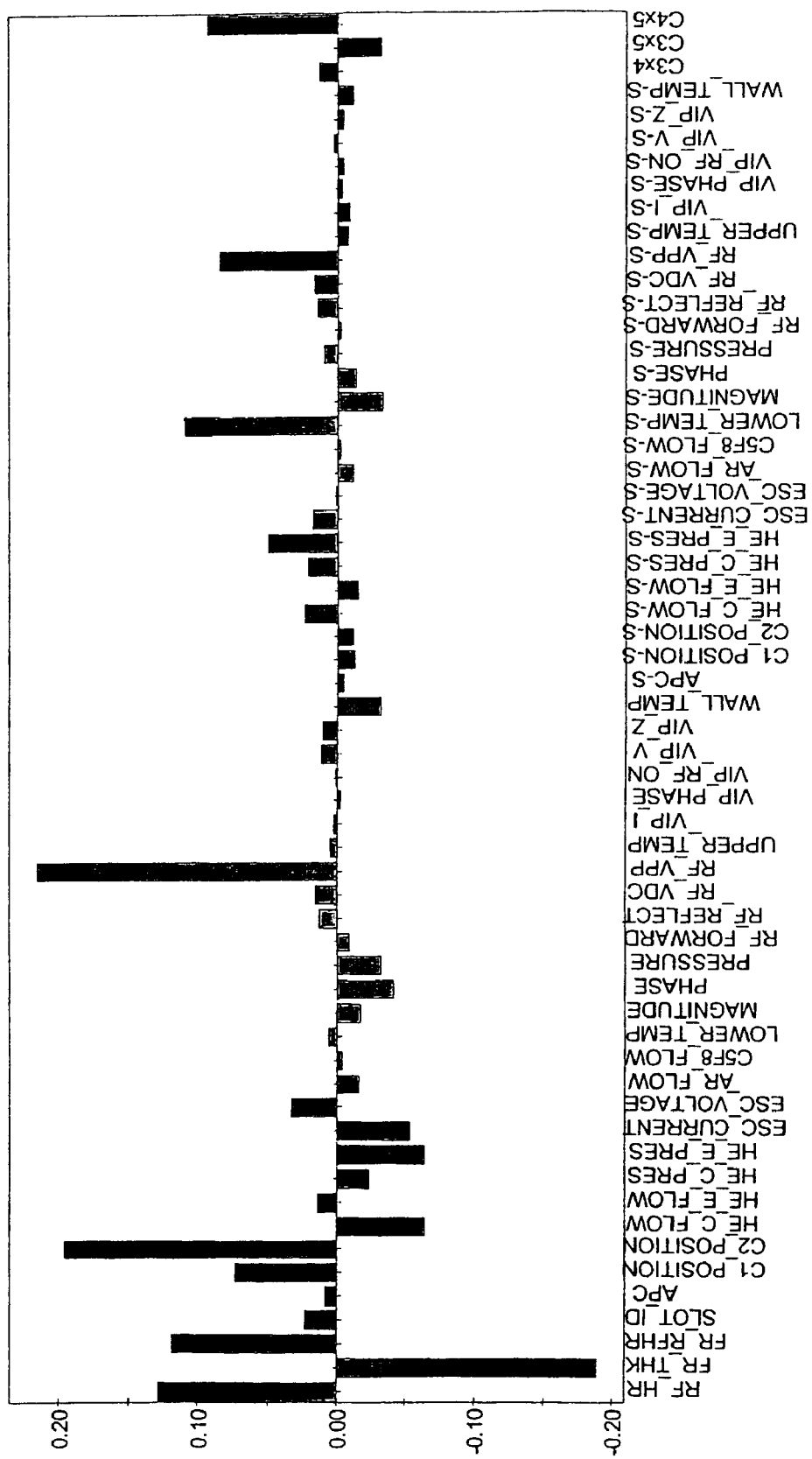
FIG. 10 presents an exemplary set of coefficients for a mean trench etch depth model.
Figure 11:
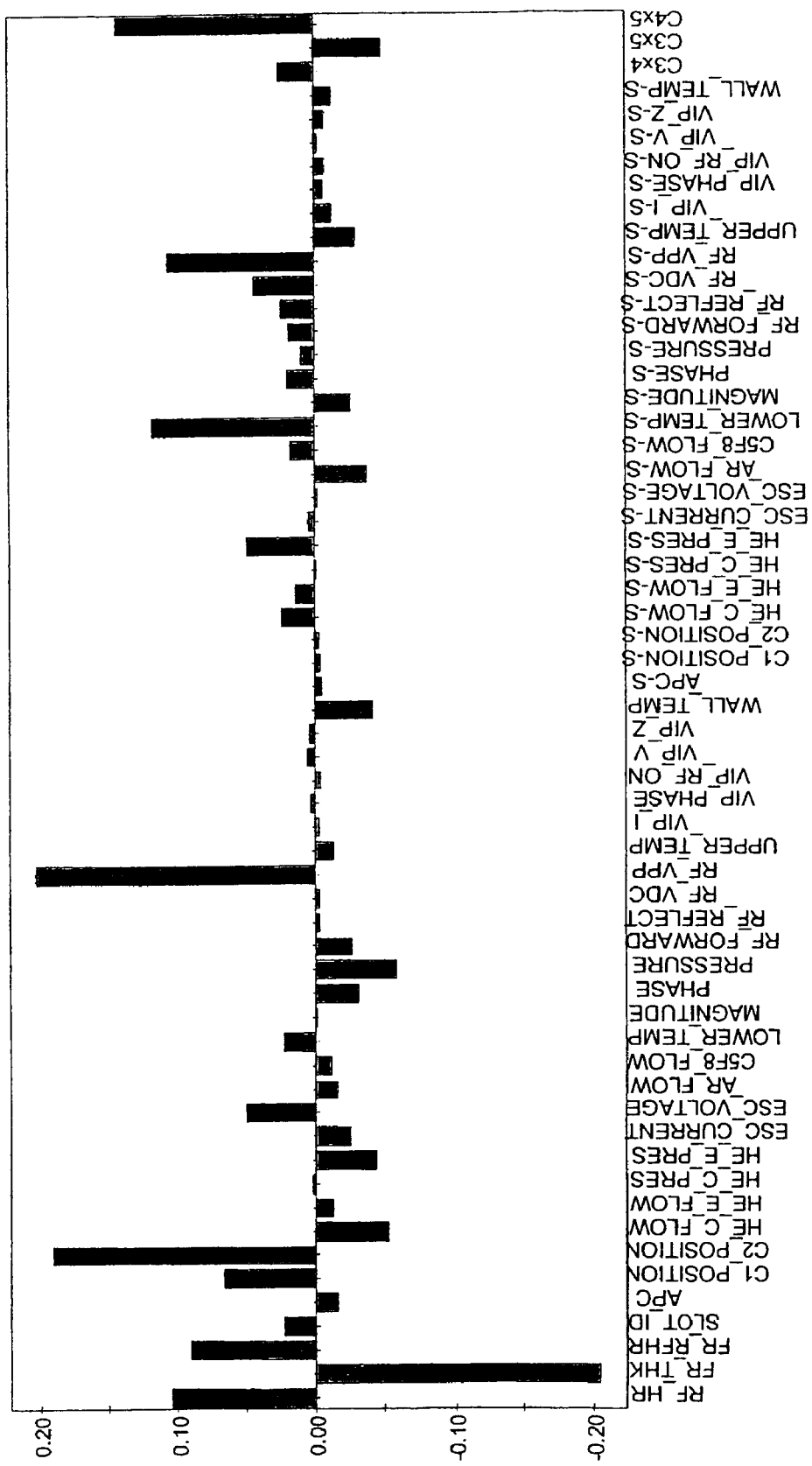
FIG. 11 presents an exemplary set of coefficients for a trench etch depth range model.

FIGS. 10 and 11 present the coefficients assigned to each tool data parameter for the mean etch depth model and the etch depth range model, respectively.

Once the PLS analysis is complete and the above output matrices have been computed, the influence on the $\overline{Y}$ matrix of every term or column in the $\overline{X}$ matrix, namely, the VIP is determined. VIP is the sum over all model dimensions of the contributions variable influence (VIN). For a given PLS dimension, $(VIN)_{ij}^2$ is related to the squared PLS weight $(w_{ij})^2$ of that term. The accumulated (over all PLS dimensions) value, $$VIP_j = \sum_i (VIN)_{i,j}^2, \qquad (3)$$

is used for further analysis. Once the VIPs are computed for each variable in matrix $\overline{X}$, they may be sorted and plotted in descending order against the variable number. Those variables with the largest VIP will have the greatest impact on the process performance data in matrix $\overline{Y}$.

Figure 12:
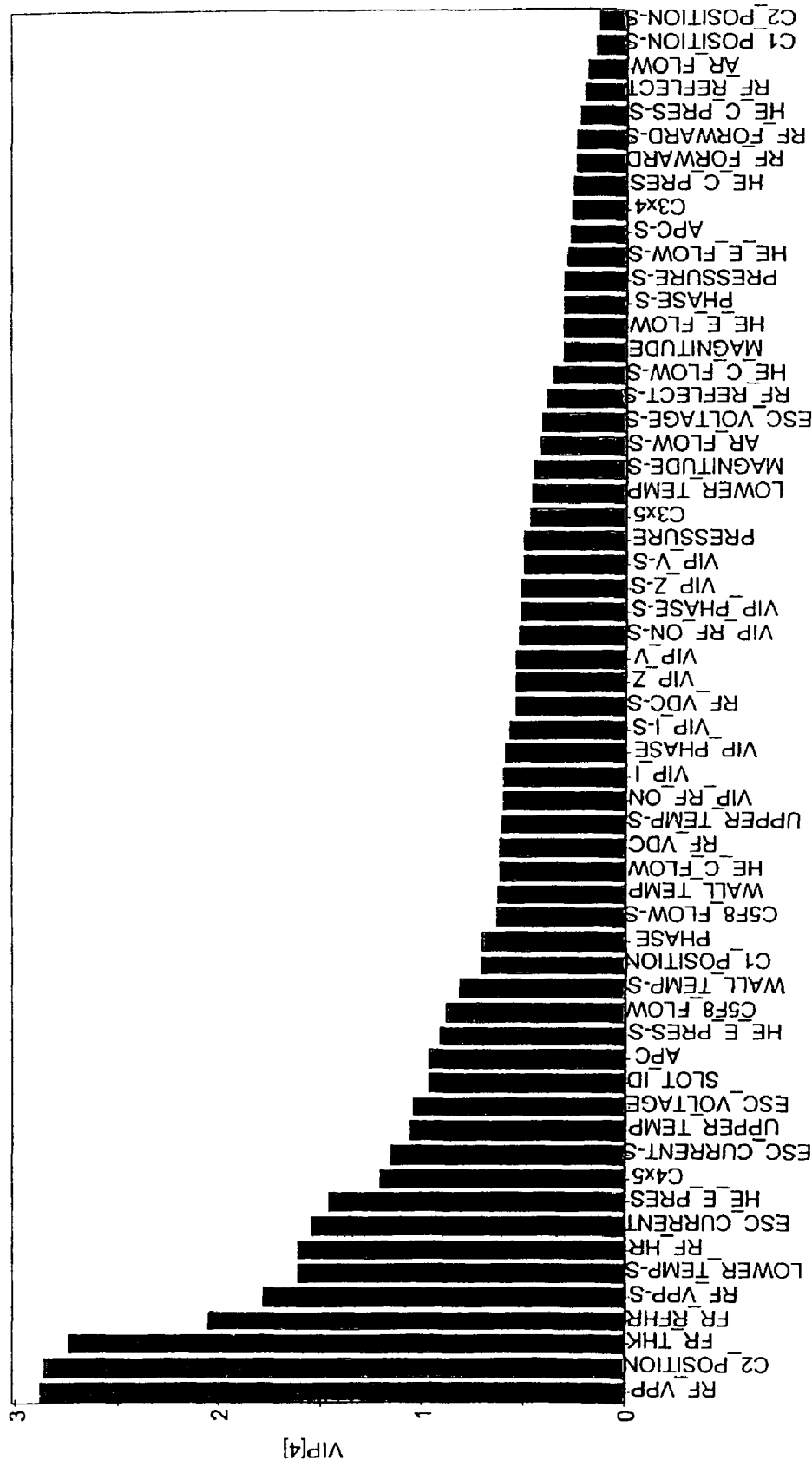
FIG. 12 presents an exemplary distribution for a set of variable importance in the projection (VIP) data.

For example, FIG. 12 shows the VIP (for a four PLS component model) in monotonically descending order; i.e., the tool data parameters falling on the left hand side of the plot are the most significant parameters in the model.

Figure 13:
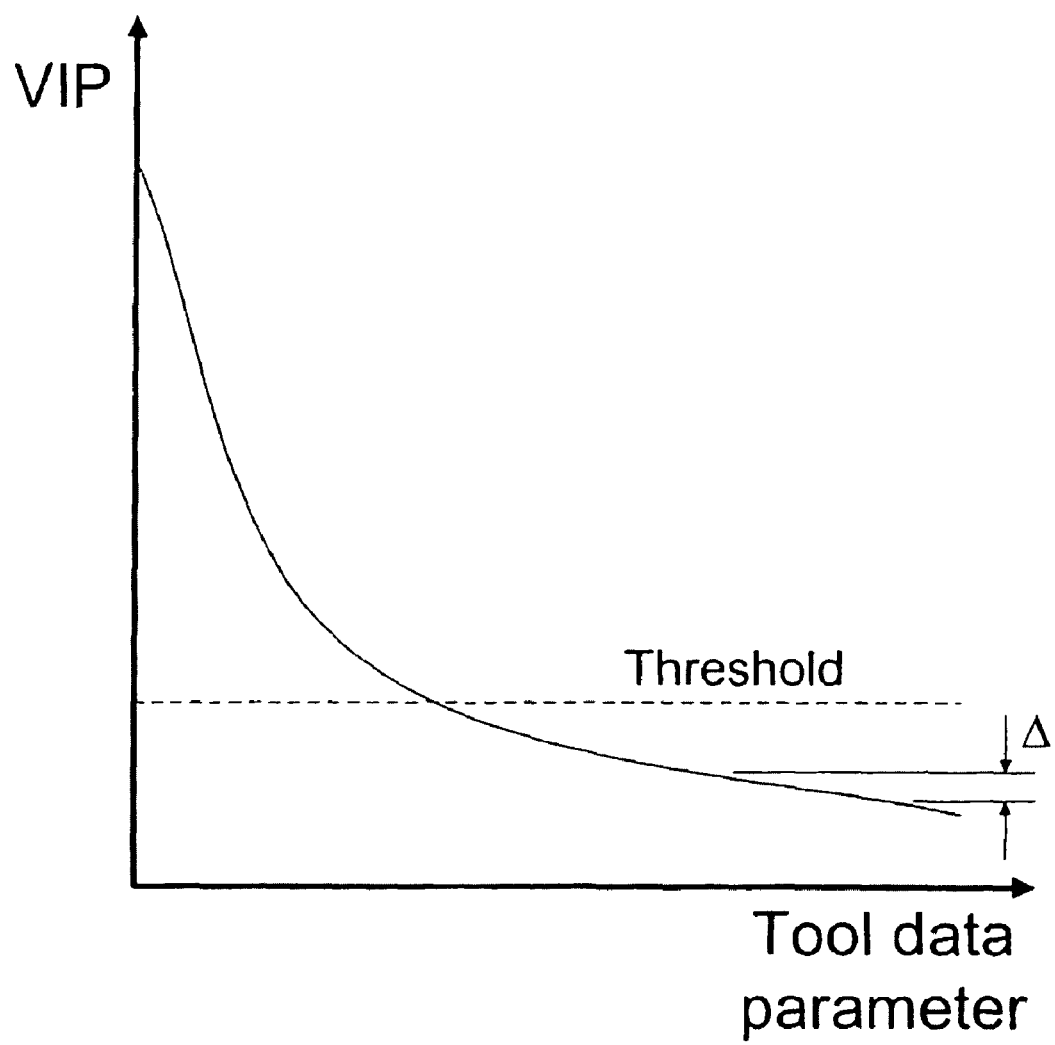
FIG. 13 shows exemplary criteria for refining the tool data using VIP data.

Using the VIP data of FIG. 12, one can assess the relative significance of a given tool data parameter on the process performance data $\overline{Y}$, and thereby refine the data matrix $\overline{X}$ by reducing the variable dimension n of the original data matrix $\overline{X}$. Exemplary criterion used to discard the variables of minimal impact or little significance to the process performance data include the following: (1) discard those variables whose VIP falls less than a pre-specified threshold (see FIG. 13); (2) discard those variables associated with VIPs in the lowest $10^{th}$ percentile or within some other predetermined range (or, in other words, retain those variables associated with the largest VIP in the top $90^{th}$ percentile; note that the percentile threshold or range selected can be different from the 90/10 embodiment described herein); and (3) use the first, second or higher derivative of the VIP with respect to the variable number to select a value for the VIP, below which or above which those variables are discarded (i.e., a maximum in the first or second derivative, or when the first derivative becomes less than a predetermined threshold slope).

Using any one of the above-mentioned criteria, one can then discard those variables that have minimal impact on the process performance data. This data reduction or refinement, in turn, reduces the column space of the data matrix $\overline{X}$ from p (sixty-one in the above example) to q (e.g., <sixty-one parameters), and forms a "new", reduced or refined data matrix $\overline{X}^*$ of dimensions m by q (forty-five by <sixty-one). Once an initial data reduction has taken place, one may store those tool data parameters important for establishing a "good" model between the tool data and the process performance data. Thereafter, further refinement or reduction of the data matrix $\overline{X}^*$ can be performed, and/or the method can proceed with re-computing the output matrices from the PLS analysis model using the reduced data matrix $\overline{X}^*$ and determining the correlation matrix $\overline{B}$ for establishing the relationship between the tool data and the process performance data.

At this point, the PLS model is repeated following the schematic presented in FIG. 6, except now the reduced matrix $\overline{X}^*$ is used as the input to the PLS analysis. The output matrices are then recomputed. As stated above, the VIPs can be studied following the description associated with FIG. 13 to further refine the data matrix $\overline{X}^*$, or the correlation matrix $\overline{B}$ may be evaluated from the output data using the relationship:

$$\overline{B} = \overline{W}(\overline{P}^T \overline{W})^{-1} \overline{C}^T. \qquad (4)$$

Once the data matrix $\overline{X}^*$ has been optimized, a final pass through the PLS analysis is generally required to update or re-compute the output matrices necessary for computing the correlation matrix $\overline{B}$. Hereinafter, the evaluation of equation (4) leads to a set of correlation coefficients to be used for extracting the predicted process performance data from the sampled tool data.

Figure 14:
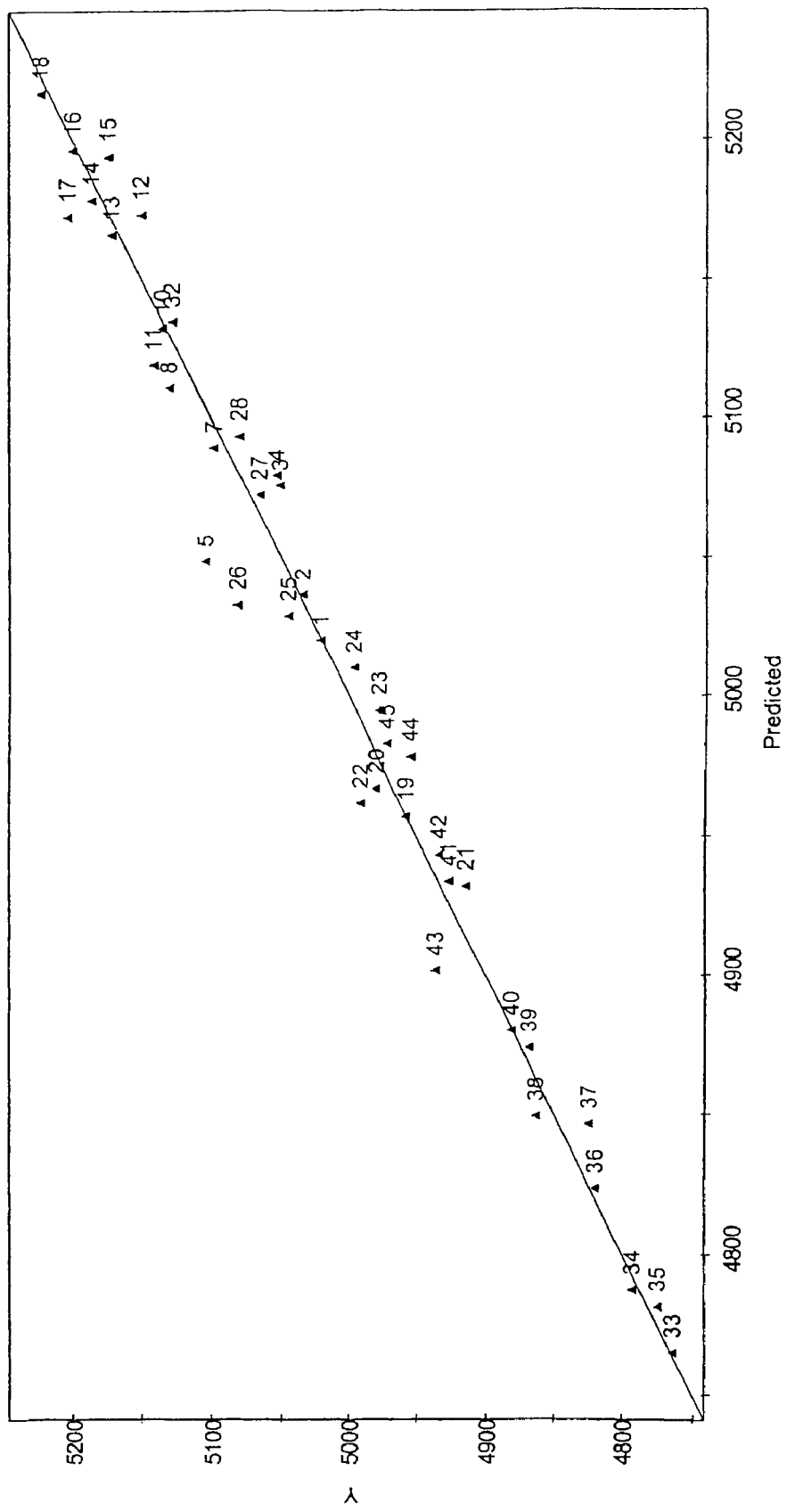
FIG. 14 presents an exemplary comparison between the observed mean trench etch depth and the predicted mean trench etch depth.
Figure 15:
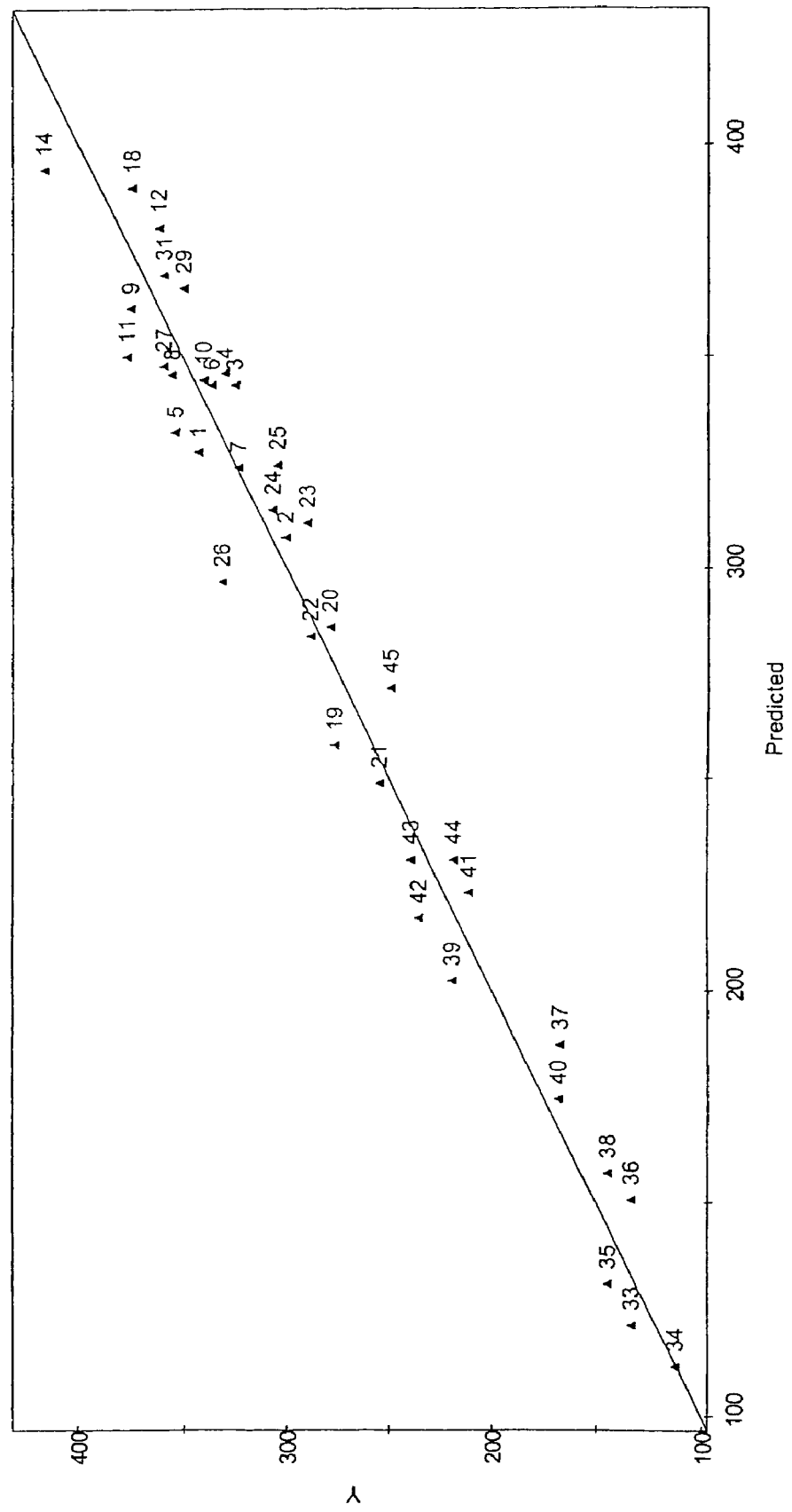
FIG. 15 presents an exemplary comparison between the observed trench etch depth range and the predicted trench etch depth range.

FIG. 14 presents the measured mean trench etch depth versus the predicted mean trench etch depth, and FIG. 15 presents the measured trench etch depth range versus the predicted trench etch depth range. A slope of unity indicates a good agreement between the measured and predicted values.

Figure 16:
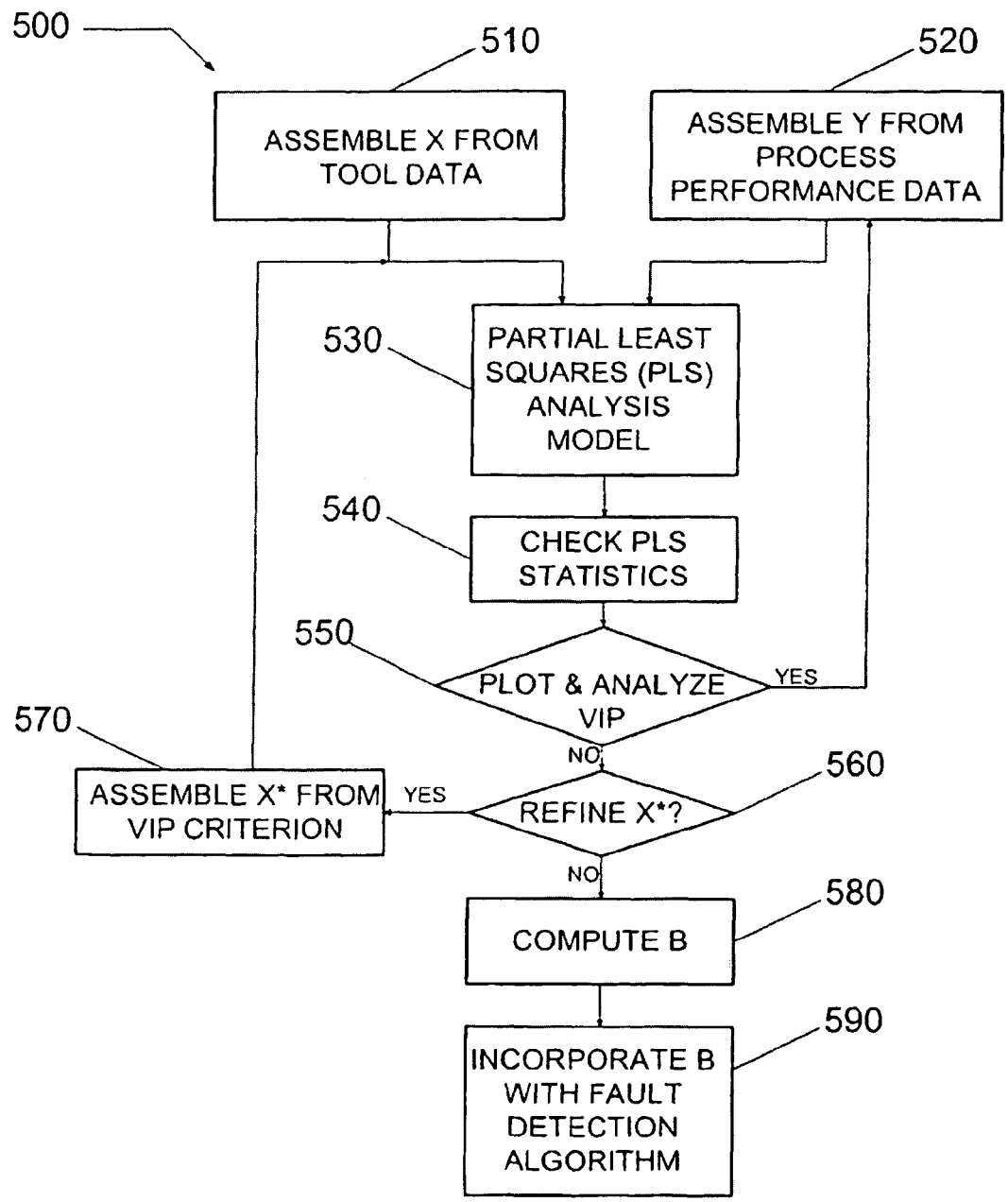
FIG. 16 presents an exemplary flow diagram of a method of constructing a process performance prediction model according to an embodiment of the present invention.

An exemplary method for constructing a process performance prediction model according to an embodiment of the present invention is set forth in FIG. 16. Method 500 begins with step 510 where the matrix $\overline{X}$ is assembled from the observed tool data. As described above, each column represents a different tool data parameter and each row represents an observation. Similarly, in step 520, the matrix $\overline{Y}$ is assembled using observed process performance data. Again, each column represents a different process performance data parameter and each row represents an observation. In step 530, matrices $\overline{X}$ and $\overline{Y}$ are input into the PLS analysis model to compute the above described output data (e.g., loading data, weighting data, scores data, VIP data, etc.). (See FIGS. 6 through 12.) In step 540, the PLS output statistics are checked to determine if the PLS fitting power and/or predictive power are acceptable. In step 550, the VIP data are plotted and analyzed in descending order as in FIG. 12. Using the data in step 550 from the PLS analysis, a decision whether to refine the matrix $\overline{X}$ is performed in step 560. If refinement (i.e., reduction of the number of tool data parameters to only significant tool data parameters) is required, then the procedure repeats the PLS analysis following step 570 with the new data matrix $\overline{X}^*$ in order to re-compute the corresponding new weighting, loading, variable influence, and score matrices. In step 570, the criterion described in association with the VIP information presented in FIG. 12 are utilized to reduce the matrix $\overline{X}$ to a new matrix $\overline{X}^*$, where the reduced matrix has discarded those variables (columns) deemed unimportant for the process performance data (i.e., there is a weak correlation or minimal impact between the tool data parameter and the process performance data). Once step 560 determines that matrix $\overline{X}^*$ is finalized, step 580 is performed. Step 580 includes computing the correlation matrix $\overline{B}$ from equation (4) for later use as a process performance prediction model. In step 590, the process performance prediction model is incorporated with, for example, a fault detection algorithm.

Once the correlation matrix $\overline{B}$ has been evaluated (or the process performance prediction model formulated), the correlation matrix $\overline{B}$ can be used as part of a fault detection algorithm to provide robust determination and prediction of process faults. The fault detection algorithm can, in general, be applied to a variety of processes, however, the specific correlation matrix B developed as described above will be specific to a particular process in a specific process tool. For example, silicon processing, such as etching, can be performed in a process tool much like that depicted in FIGS. 1 through 5.

Figure 17:
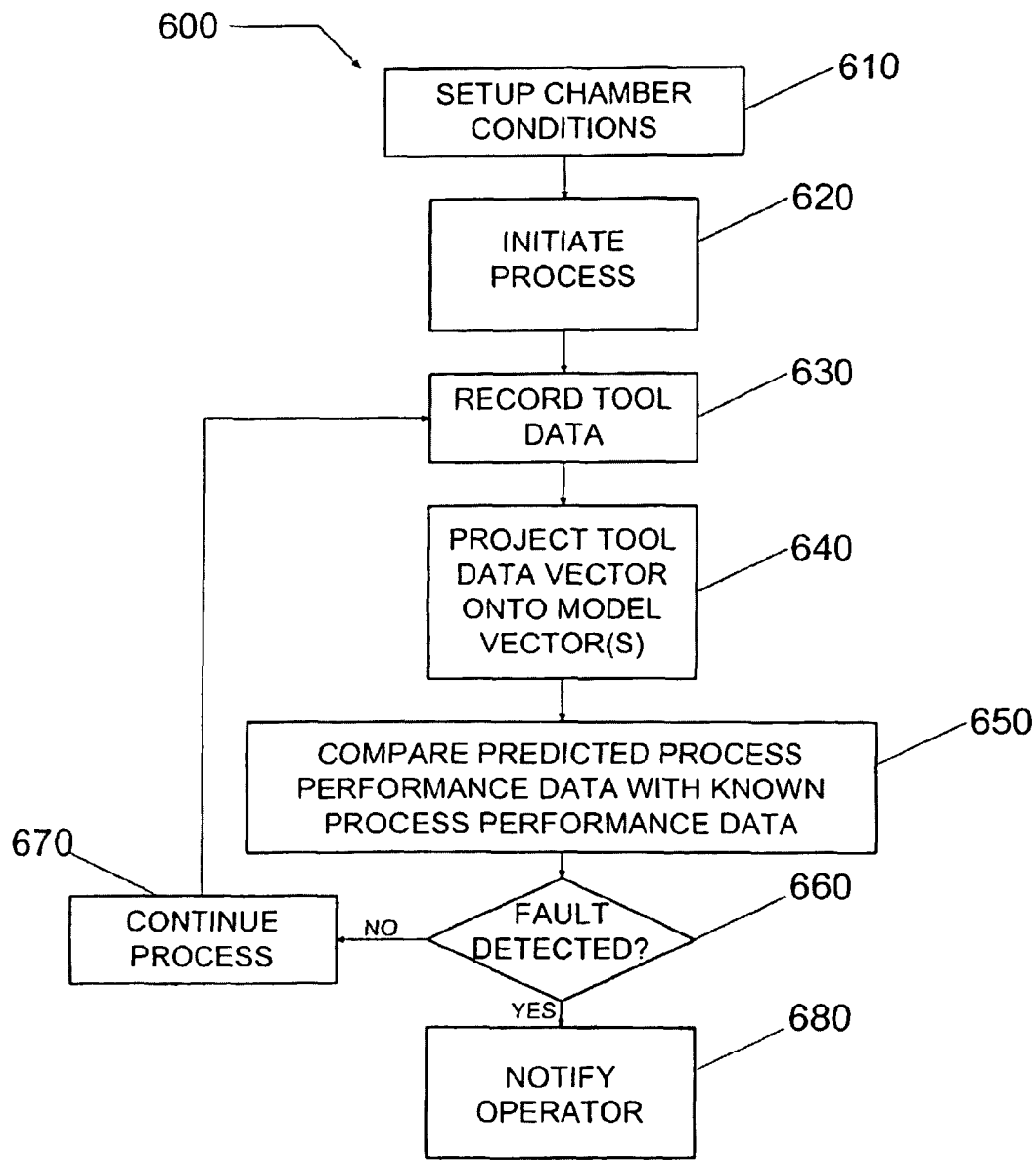
FIG. 17 presents an exemplary flow diagram of a method of fault detection using a process performance prediction model according to an embodiment of the present invention.

FIG. 17 presents a flow diagram of a method of detecting a fault condition for a material processing system employing a process performance prediction model according to an embodiment of the present invention. The method 600 begins with step 610 by preparing the chamber conditions for the specific process. For example, the chamber setup includes loading the substrate to be processed, pumping down the vacuum chamber to a base pressure, initiating the flow of process gas, and adjusting the vacuum pump throttle valve to establish the chamber process pressure. In step 620, the plasma is ignited via, for example, the application of RF power to an electrode as discussed with reference to FIGS. 2 through 5, thereby initiating the process. In step 630, an observation of tool data is recorded. In step 640, the established process performance prediction model is used with the observed tool data to predict the process performance data, which includes projecting the recorded tool data onto the one or more correlation data (process performance prediction model) via, for example, vector multiplication (or matrix multiplication). In step 650, the predicted process performance data are compared with target process performance data. The comparison can include forming difference data from a numerical difference between the predicted process performance data and the target process performance data (see Δ in FIG. 13), the square of a numerical difference, etc. In step 660, the difference data is compared with threshold difference data, where a fault is detected and/or predicted for the process when the difference data exceeds the threshold difference data and, conversely, the process is operating within an acceptable range when the difference data do not exceed the threshold difference data. If the process is operating within an acceptable range, then the process can continue in step 670. If a fault is detected or predicted, then an operator can be notified in step 680.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for constructing a process performance prediction model for a material processing system, the method comprising the steps of:
    recording tool data for a plurality of observations during a process in a process tool, said tool data comprises a plurality of tool data parameters;
    recording process performance data for said plurality of observations during said process in said process tool, said process performance data comprises one or more process performance parameters;
    performing a partial least squares analysis using said tool data and said process performance data; and
    computing correlation data from said partial least squares analysis,
    wherein said process performance data comprises at least one of mean etch depth and etch depth range.

2. The method for constructing a process performance prediction model as recited in claim 1, wherein said step of recording tool data for a plurality of observations includes the step of forming a tool data matrix.

3. The method for constructing a process performance prediction model as recited in claim 1, wherein said step of recording process performance data for said plurality of observations includes the step of forming a process performance data matrix.

4. The method for constructing a process performance prediction model as recited in claim 1, wherein said correlation data comprises a correlation matrix.

5. A method for constructing a process performance prediction model for a material processing system, the method comprising the steps of:
    recording tool data for a plurality of observations during a process in a process tool, said tool data comprises a plurality of tool data parameters;
    recording process performance data for said plurality of observations during said process in said process tool, said process performance data comprises one or more process performance parameters;
    performing a partial least squares analysis using said tool data and said process performance data; and
    computing correlation data from said partial least squares analysis,
    wherein said tool data comprises at least one of a capacitor position, a forward radio frequency (RF) power, a reflected RF power, a voltage, a current, a phase, an impedance, a RF peak-to-peak voltage, a RF self-induced direct current bias, a chamber pressure, a gas flow rate, a temperature, a backside gas pressure, a backside gas flow rate, an electrostatic clamp voltage, an electrostatic clamp current, a focus ring thickness, RF hours, and focus ring RF hours.

6. A method for constructing a process performance prediction model for a material processing system, the method comprising the steps of:
    recording tool data for a plurality of observations during a process in a process tool, said tool data comprises a plurality of tool data parameters;
    recording process performance data for said plurality of observations during said process in said process tool, said process performance data comprises one or more process performance parameters;
    performing a partial least squares analysis using said tool data and said process performance data; and
    computing correlation data from said partial least squares analysis,
    wherein said step of performing a partial least squares analysis includes,
        calculating variable importance in projection data defined as an influence on said process performance data of said tool data, and
        refining said tool data based upon an analysis of the variable importance in projection data.

7. The method for constructing a process performance prediction model as recited in claim 6, wherein said step of performing a partial least squares analysis includes the step of determining a minimum number of partial least squares components that substantially explain a correlation between said tool data and said process performance data.

8. The method for constructing a process performance prediction model as recited in claim 6, wherein said step of performing a partial least squares analysis includes the step of verifying the fitting power of said process performance prediction model by inspecting at least one of a fraction of a sum of squares of all of said tool data and said process performance data explained by the partial least squares component, a fraction of a variance of all of said tool data and said process performance data explained by the partial least squares component, a cumulative sum of squares of all of said tool data and said process performance data explained by the partial least squares component, and a cumulative variance of all of said tool data and said process performance data explained by the partial least squares component.

9. The method for constructing a process performance prediction model as recited in claim 6, wherein said step of performing a partial least squares analysis includes the step of verifying the predictive power of said process performance prediction model by performing cross validation.

10. A method for detecting a fault in a material processing system using a process performance prediction model, the method comprising the steps of:
   initiating a process in a process tool of said material processing system;
   recording tool data for at least one observation during said process in said process tool to form a tool data matrix, said tool data comprises a plurality of tool data parameters;
   performing a matrix multiplication of said tool data matrix and a correlation matrix to form predicted process performance data, said correlation matrix comprising said process performance prediction model;
   comparing said predicted process performance data with target process performance data; and
   determining a fault condition of said material processing system from said comparing step,
   wherein said step of comparing said predicted process performance data with target process performance data comprises determining difference data between said predicted process performance data and said target process performance data, and
   said step of determining a fault condition of said material processing system comprises comparing said difference data with threshold difference data.

11. The method for detecting a fault in a material processing system as recited in claim 10, wherein a fault in said material processing system is detected when said difference data exceeds said threshold difference data.

12. A method for detecting a fault in a material processing system, the method comprising the steps of:
   recording first tool data for a plurality of observations during a first process in a process tool to form a first tool data matrix, said first tool data comprises a plurality of tool data parameters;
   recording first process performance data for said plurality of observations during said first process in said process tool to form a first process performance data matrix, said first process performance data comprises one or more process performance parameters;
   performing a partial least squares analysis using said first tool data matrix and said first process performance data matrix;
   computing a correlation matrix from said partial least squares analysis, said correlation matrix comprises a process performance prediction model;
   performing a matrix multiplication of said first tool data matrix and said correlation matrix to form target process performance data;
   initiating a second process in said process tool of said material processing system;
   recording second tool data for at least one observation during said second process in said process tool to form a second tool data matrix, said second tool data matrix comprises said plurality of tool data parameters;
   performing a matrix multiplication of said second tool data matrix and said correlation matrix to form predicted process performance data;
   comparing said predicted process performance data with target process performance data; and
   determining a fault condition of said material processing system from said comparing step,
   wherein said step of comparing said predicted process performance data with a target process performance data comprises determining difference data between said predicted process performance data and said target process performance data, and
   said step of determining a fault condition of said material processing system comprises comparing said difference data with threshold difference data.

13. The method for detecting a fault in a material processing system as recited in claim 12, wherein said first process performance data and said predicted process performance data comprises at least one of mean etch depth and etch depth range.

14. The method for detecting a fault in a material processing system as recited in claim 12, wherein said first tool data and said second tool data comprises at least one of a capacitor position, a forward RF power, a reflected RF power, a voltage, a current, a phase, an impedance, a RF peak-to-peak voltage, a RF self-induced DC bias, a chamber pressure, a gas flow rate, a temperature, a backside gas pressure, a backside gas flow rate, an electrostatic clamp voltage, an electrostatic clamp current, a focus ring thickness, RF hours, and focus ring RF hours.

15. The method for detecting a fault in a material processing system as recited in claim 12, wherein said step of performing a partial least squares analysis includes the step of determining a minimum number of partial least squares components that substantially explains a correlation between said first tool data and said first process performance data.

16. The method for detecting a fault in a material processing system as recited in claim 12, wherein said step of performing a partial least squares analysis includes the steps of:
   calculating variable importance in projection data defined as an influence on said first process performance data matrix of said first tool data matrix; and
   refining said first tool data matrix based upon an analysis of the variable importance in projection data.

17. The method for detecting a fault in a material processing system as recited in claim 12, wherein said step of performing a partial least squares analysis includes the step of verifying the fitting power of said process performance prediction model by inspecting at least one of a fraction of a sum of squares of all of said first tool data and said first process performance data explained by a partial least squares component, a fraction of a variance of all of said first tool data and said first process performance data explained by a partial least squares component, a cumulative sum of squares of all of said first tool data and said first process performance data explained by a partial least squares component, and a cumulative variance of all of said first tool data and said first process performance data explained by a partial least squares component.

18. The method for detecting a fault in a material processing system as recited in claim 12, wherein said step of performing a partial least squares analysis includes the step of verifying the predictive power of said process performance prediction model by performing cross validation.

19. The method for detecting a fault in a material processing system as recited in claim 12, wherein a fault in said material processing system is detected when said difference data exceeds said threshold difference data.

* * * * *